(12) United States Patent
Gadiraju et al.

(10) Patent No.: US 8,941,372 B2
(45) Date of Patent: Jan. 27, 2015

(54) SYSTEMS AND METHODS FOR PREDICTING POWER SYSTEM INSTABILITY

(75) Inventors: Kasi Viswanadha Raju Gadiraju, Bangalore (IN); Amol Kolwalkar, Bangalore (IN); Gurunath Gurrala, Bangalore (IN)

(73) Assignee: General Electric Company, Niskayuna, NY (US)

( * ) Notice: Subject to any disclaimer, the term of this patent is extended or adjusted under 35 U.S.C. 154(b) by 377 days.

(21) Appl. No.: 13/331,085

(22) Filed: Dec. 20, 2011

(65) Prior Publication Data
US 2013/0154614 A1    Jun. 20, 2013

(51) Int. Cl.
*G01R 11/63*    (2006.01)
*G01R 19/00*    (2006.01)
*H02J 3/00*    (2006.01)

(52) U.S. Cl.
CPC .. *H02J 3/00* (2013.01); *G01R 11/63* (2013.01)
USPC .................................................. 324/103 R

(58) Field of Classification Search
None
See application file for complete search history.

(56) References Cited

U.S. PATENT DOCUMENTS

| 7,236,898 | B2 * | 6/2007 | Kim et al. ................. 702/65 |
| 7,710,729 | B2 | 5/2010 | Li et al. |
| 7,860,702 | B1 * | 12/2010 | Evans et al. ................ 703/18 |
| 7,904,261 | B2 | 3/2011 | Atanackovic et al. |
| 8,126,667 | B2 * | 2/2012 | Zhang et al. ............... 702/65 |
| 8,788,244 | B2 * | 7/2014 | Venkatasubramanian et al. ........................ 703/2 |
| 2010/0094477 | A1 | 4/2010 | Berggren et al. |

OTHER PUBLICATIONS

Angela et al., "Estimation of Rotor Angles of Synchronous Machines using Artificial Neural Networks and Local PMU-based Quantities", Neurocomputing, vol. 70, Issue 16-18, pp. 2668-2678, Oct. 2007.
Gholami et al., "Voltage State Estimation by ANNs with Reduction of PMUs", Paper Presentation.

* cited by examiner

*Primary Examiner* — Paresh Patel
(74) *Attorney, Agent, or Firm* — Nitin N. Joshi

(57) ABSTRACT

Certain embodiments of the invention may include systems and methods for predicting power system instability. According to an example embodiment of the invention, a method is provided for predicting voltage collapse or instability in a power system. The method can include sampling measurement values associated with one or more busses, wherein the measurement values include current on respective lines associated with a bus; and voltage associated with the bus. The method can further include determining a change in reactive power loss ($\Delta Q_{loss}$) on input lines feeding the bus; determining a change in real power flow ($\Delta P_{flow}$) on input or output lines associated with the bus; and determining a voltage stability index (VSI) at the bus based at least in part on the determined $\Delta Q_{loss}$ and the $\Delta P_{flow}$.

16 Claims, 4 Drawing Sheets

SYSTEMS AND METHODS FOR PREDICTING POWER SYSTEM INSTABILITY

FIELD OF THE INVENTION

This invention generally relates to electrical power systems, and in particular, to systems and methods for predicting power system instability.

BACKGROUND OF THE INVENTION

The basic structure of an electric power system includes various hardware elements such as generators, transformers, power lines, and real-time monitoring equipment. Certain software enables monitoring and control of the electric power systems with computer systems. The software can include power flow analysis software, fault detection software, and restoration software for generation, transmission, and distribution of electricity.

A frequently occurring situation in an electric power system is the need to transmit more power over the system than it was originally designed for. In cases where there is a need to transmit more power, and building new transmission lines is prohibitive due to cost, right-of-way, or environmental constraints, increased utilization of existing transmission lines and equipment is desirable.

Furthermore, with increased distributed generation, the integration of distributed generators into existing power systems presents technical challenges such as voltage regulation, stability, power quality problems. Typically, electrical power systems are monitored and controlled to provide continuous and reliable service; however, power systems outages can still occur and are often associated with voltage instabilities. Voltage collapse in certain areas of a power network can lead to blackouts, which can result in revenue loss for both customers and the utilities. One cause for voltage collapse can be attributed to lack of reactive power resources in the system, or the improper application thereof. As the grid becomes more complex, network voltage stability becomes even more critical for utilities to provide reliable service.

BRIEF SUMMARY OF THE INVENTION

Some or all of the above needs may be addressed by certain embodiments of the invention. Certain embodiments of the invention may include systems and methods for predicting power system instability.

According to an example embodiment of the invention, a method is provided for predicting voltage collapse or instability in a power system. The method can include sampling measurement values associated with one or more busses, wherein the measurement values include current on respective lines associated with a bus; and voltage associated with the bus. The method can further include determining a change in reactive power loss ($\Delta Q_{loss}$) on input lines feeding the bus; determining a change in real power flow ($\Delta P_{flow}$) on input or output lines associated with the bus; and determining a voltage stability index (VSI) at the bus based at least in part on the determined $\Delta Q_{loss}$ and the $\Delta P_{flow}$.

According to another example embodiment, a system is provided. The system includes at least one memory for storing data and computer-executable instructions; and at least one processor configured to access the at least one memory and further configured to execute the computer-executable instructions for: sampling measurement values associated with one or more busses, wherein the measurement values comprise: current on respective lines associated with a bus; and voltage associated with the bus; determining a change in reactive power loss ($\Delta Q_{loss}$) on input lines feeding the bus; determining a change in real power flow ($\Delta P_{flow}$) on input or output lines associated with the bus; and determining a VSI at the bus based at least in part on the determined $\Delta Q_{loss}$ and the $\Delta P_{flow}$.

Other embodiments, features, and aspects of the invention are described in detail herein and are considered a part of the claimed inventions. Other embodiments, features, and aspects can be understood with reference to the following detailed description, accompanying drawings, and claims.

BRIEF DESCRIPTION OF THE FIGURES

Reference will now be made to the accompanying tables and drawings, which are not necessarily drawn to scale, and wherein.

DETAILED DESCRIPTION OF THE INVENTION

Embodiments of the invention will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
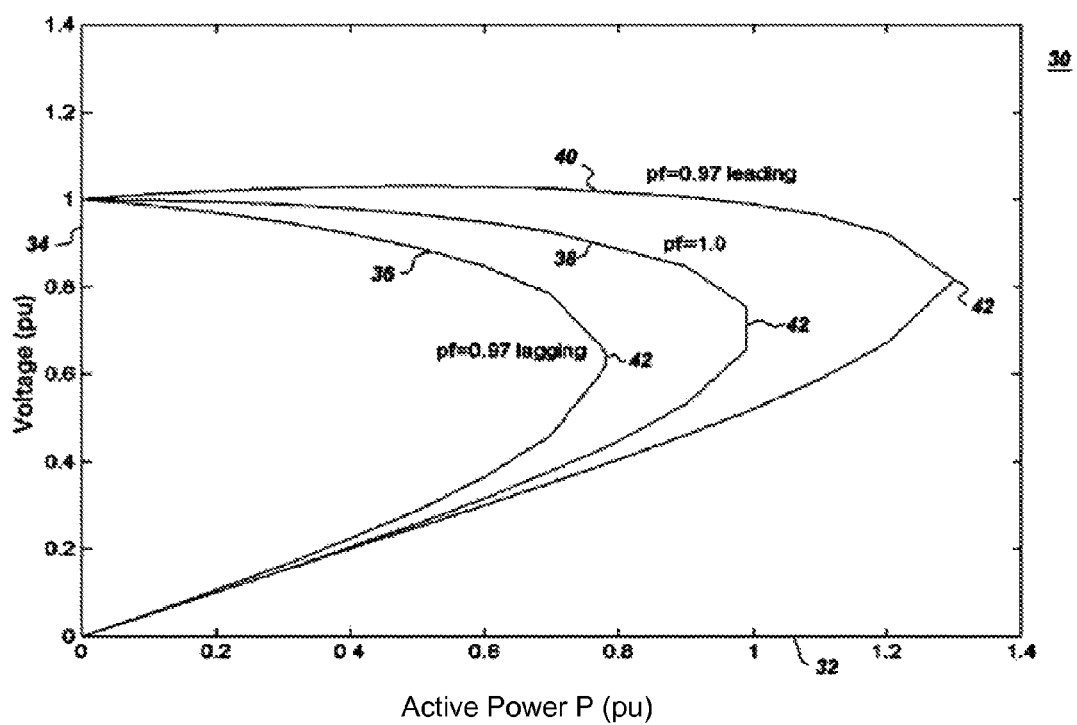
FIG. 1 depicts a sample power-voltage curve.

FIG. 1 shows a graphical representation 30 of a power-voltage (P-V) curve of an electrical power system. A horizontal axis 32 represents the active power P in terms of per unit (pu) and a vertical axis 34 represents a line voltage in pu. Three plots 36, 38, 40 represent P-V curves for three different power factors (i.e., 0.97 lagging, unity, and 0.97 leading respectively). A nose point 42 on each of the curves represents a voltage stability limit at the respective power factor. As will be appreciated by those skilled in the art, a nose point refers to a point at which voltage collapse occurs. That is, although with increased load or the active power, the voltage also varies slightly but beyond nose point 42, the voltage decreases sharply to 0 pu. This condition results from reactive power losses significantly exceeding the reactive resources available to supply them. As can be seen from the three curves 36, 38, 40, the line voltage variation depends on the power factor and with higher or leading power factors, the nose point occurs at higher voltages. In other words with higher or leading power factors, the system becomes more stable.

According to certain example embodiments of the invention, a load-flow calculation may utilize phasor measurement unit (PMU) measurements to predict voltage instability problems. In power engineering, the PMU is commonly referred to as a synchrophasor, and it can be a dedicated device, or the PMU function can be incorporated into a protective relay or other device. According to example embodiments, PMUs can be sampled from widely dispersed locations in the power system network and synchronized from the common time source of a global positioning system (GPS) radio clock. In example embodiments, the PMU can provide measurement information for system operators and planners to determine the state of the electrical system, to manage power quality, and to assess system conditions.

In an example embodiment, network power flow and voltage may be monitored and the load-flow calculation can provide voltage profiles for nodes and loading of network components, such as cables and transformers. With this information, compliance to operating limitations, such as those stipulated by voltage ranges and maximum loads, can be examined and remediation may be applied. According to example embodiments, the load-flow calculations may also support the planning for economical operation of the network. Example embodiments may provide a determination of losses, and may further be utilized to determine the required reactive-power allocation to maintain stability.

According to example embodiments, the load-flow calculations may be utilized for operational and economical benefits. For example, such calculations may provide information that may allow stable switching from single and/or multi-phase in-feed low-voltage meshed networks to isolated networks. Example embodiments may further provide information for predicting instabilities, and associated necessary remedial action, for example, during motor start-up, scheduled outages, unscheduled outages, etc.

Figure 2:
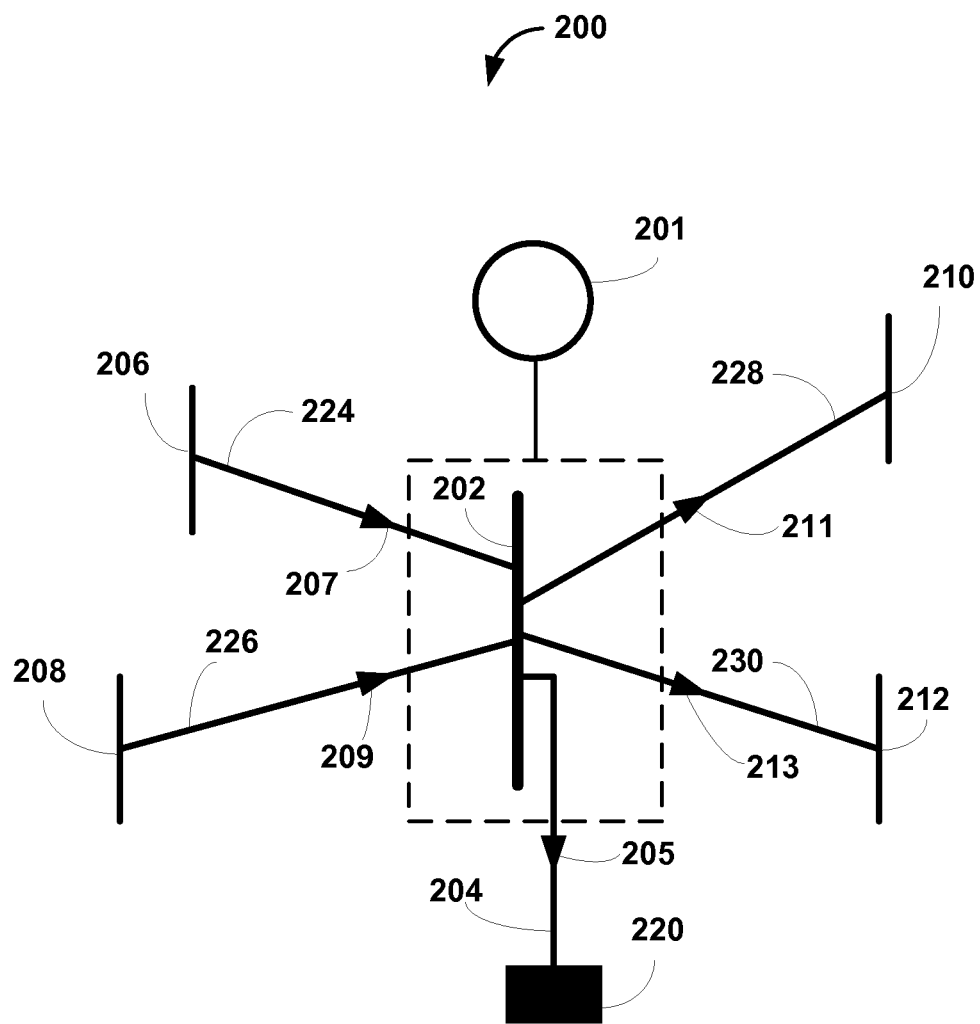
FIG. 2 is a block diagram of an illustrative power network node according to an example embodiment of the invention.

FIG. 2 illustrates an example power network node 200. According to example embodiments of the invention, a PMU 201 may be utilized for monitoring voltage and current associated with the power network node 200. For example, the PMU 201 may measure voltage and current associated with a bus 202. According to example embodiments, the bus 202 may connect with one or more buses 206, 208, 210, 212 and power may flow between these buses. In an example embodiment, and as illustrated in FIG. 2, a node 200 may include load 220 connected to bus 202 via an outgoing line 204 with an associated load current 205. In an example embodiment, the node 200 may include additional input and/or output transmission/distribution lines 224, 226, 228 and 230 between bus 202 and other buses 206, 208, 210, 212 and their associated respective currents 207, 209, 211, 213.

In accordance with example embodiments, a VSI at a bus can be expressed as $VSI=1-(\Delta P_{flow}/\Delta Q_{loss})$, where $\Delta Q_{loss}$ is summation of change in reactive power loss $Q_{loss}$ on the lines that are feeding the bus or in other words, summation of change in reactive power loss on incoming lines. Similarly, $\Delta P_{flow}$ is the summation of change in real power flow $P_{flow}$ that is leaving the bus (i.e., outgoing real power flow) including a change in real power of local load or summation of change in real power flow on incoming lines. According to an example embodiment, as the VSI approaches unity, it is an indication that the power system is approaching a point of voltage collapse.

In accordance with example embodiments, the PMU 201 may monitor the voltage associated with the bus 202 and may monitor the currents 205, 207, 209, 211, 213 going in or out of the bus 202 to determine changes in real power flow $\Delta P_{flow}$ and changes in reactive power loss $\Delta Q_{loss}$. For example, the change in outgoing real power flow may be determined by $\Delta P_{flow}=\Delta P_L+\Delta P_{14}+\Delta P_{15}$, where, $\Delta P_L$ is the change of real power flow to the load 220 via outgoing line 204, and $\Delta P_{14}$, and $\Delta P_{15}$ represent the change in outgoing real power flow on the respective transmission lines 228 and 230. Change in incoming power flow may be determined by $\Delta P_{flow}=\Delta P_{12}+\Delta P_{13}$, where $\Delta P_{12}$ and $\Delta P_{13}$ represent change of real power flow on the respective transmission lines 2244 and 226. According to an example embodiment, the change in real power flow can be computed on lines that are either incoming transmission lines or outgoing transmission lines.

According to an example embodiment, a change in incoming reactive power loss may be computed using input transmission lines, or those lines for which real power is flowing into the node. For example, if the second line 224 and the third line 226 are supplying real power to the bus 202, the change in incoming reactive power loss $\Delta Q_{loss}$ may be determined by $\Delta Q_{loss}=\Delta Q_{loss\ 21}+\Delta Q_{loss\ 31}$. In this equation $\Delta Q_{loss\ 21}$ represents change in the incoming reactive power loss on the line 224 to the bus 202, and where $\Delta Q_{loss\ 31}$, represents the change in the incoming reactive power loss on the line 226 to the bus 202.

According to an example embodiment, changes in incoming reactive power loss and outgoing real power flow on a bus may be computed using time-stamped measurements of the PMU. For example, $\Delta Q_{loss}=Q_{loss}|_{t=k+1}-Q_{loss}|_{t=k}$. Similarly $\Delta P_{flow}=P_{flow}|_{t=k+1}-P_{flow}|_{t=k}$. In these equations, t is a time sample and k is sample number. For example, if at t=k the incoming reactive power loss calculated by a processor based on PMU readings was $Q_{loss}|_{t=k}$ then at time sample t=k+1, the reactive power loss calculated will be $Q_{loss}|_{t=k+1}$ and difference of these two readings determines changes in incoming reactive power loss i.e., $\Delta Q_{loss}$. Similarly, changes in outgoing real power flow i.e., $\Delta P_{flow}$ are calculated In an example embodiment, the VSI may be computed after detecting a change in system operating conditions. For example, if there is insignificant change in operating conditions ($\Delta P_{flow} \approx 0$), then under such circumstances VSI may give a wrong or false indication of instability. Hence, according to an example embodiment, the VSI is computed only when $\Delta P_{flow}$ is greater than a pre-defined threshold. In an example embodiment, the frequency of the VSI computation may depend on the variation of system operating conditions, which may vary over a time-frame of approximately a few milliseconds to several seconds. According to an example embodiment, the rate of change of the VSI may indicate how fast the system is approaching the point of voltage collapse due to changes in system operating conditions.

According to an example embodiment, the VSI can be computed at the buses, where PMU measurements are available. In an example embodiment, comparison of the VSI among different buses may indicate which bus is more prone to voltage collapse, and corresponding remedial measures can be initiated based on the computed VSI at that bus.

Figure 3:
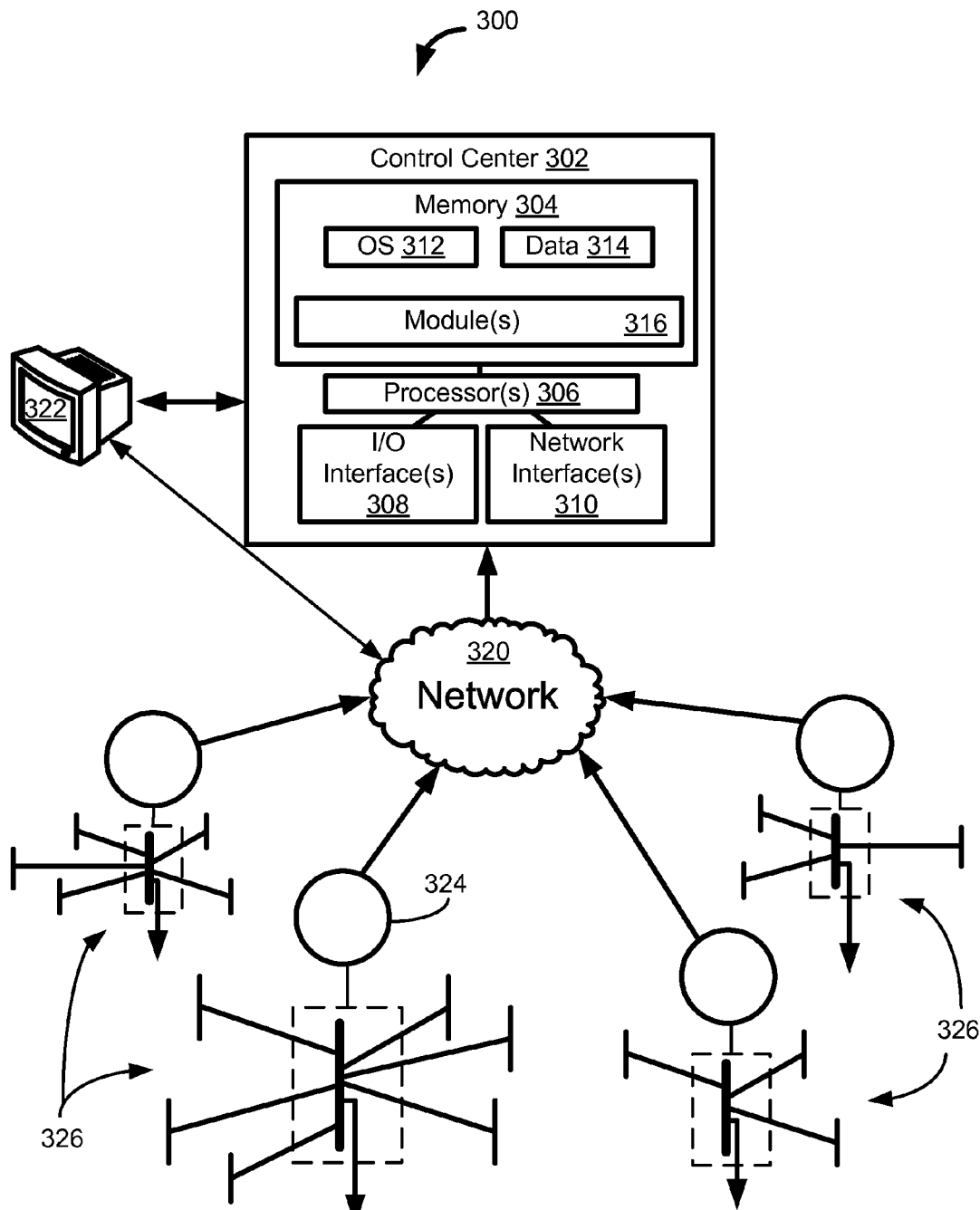
FIG. 3 is a block diagram of an illustrative control center system according to an example embodiment of the invention.

FIG. 3 depicts an example control center system 300 which may compute VSI for multiple buses, according to an example embodiment. The system 300, in an example embodiment, includes a control center computer 302, which includes a memory 304, one or more computer processors 306, and one or more input/output interfaces 308. In an example embodiment, the control center computer 302 can include one or more network interfaces 310. According to an example embodiment, the memory 304 may include an operating system 312 and data 314. According to example embodiments, PMUs 324 may take measurements at power network nodes 326 and may communicate to the control center computer 302 via the network 320. In an example embodiment, a local or remote workstation 322 may be in communication with the control center computer 302 directly, or via the network 320.

In an example embodiment, the memory 304 associated with the control center computer 302 may include one or more computer readable code modules 316. For example, one of the module(s) 316 may include computer code or instructions for directing the processor to read and process data provided by the PMUs 324. According to an example embodiment, one of the module(s) 316 may include computer code or instructions for computing the VSI associated with each of the power network nodes 326.

Figure 4:
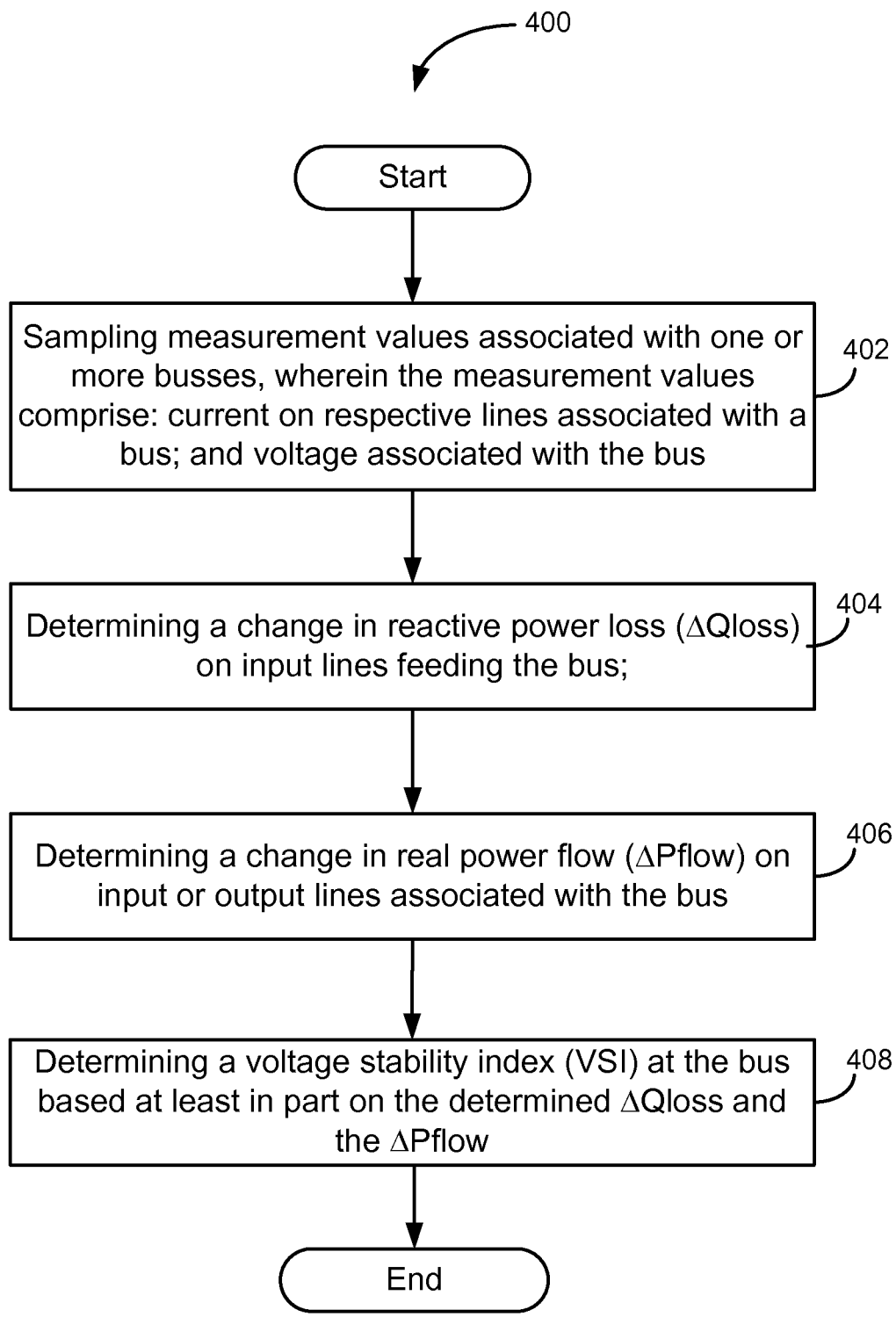
FIG. 4 is a flow diagram of an example method according to an example embodiment of the invention.

An example method 400 for predicting voltage collapse or instability in a power system will now be described with reference to the flowchart of FIG. 4. The method 400 starts in block 402 and, according to an example embodiment includes sampling measurement values associated with one or more busses, wherein the measurement values comprise: current on respective lines associated with a bus; and voltage associated with the bus. In block 404 the method 400 includes determining a change in reactive power loss ($\Delta Q_{loss}$) on input lines feeding the bus. In block 406, the method 400 includes determining a change in real power flow ($\Delta P_{flow}$) on input or output lines associated with the bus. In block 408, the method 400 includes determining a VSI at the bus based at least in part on the determined $\Delta Q_{loss}$ and the $\Delta P_{flow}$. The method 400 ends after block 408.

In accordance with example embodiments, the respective lines associated with a bus can include one or more of the lines connected to the bus. For example, the respective lines may be considered as input transmission lines if power is flowing to the bus. The lines may be considered output transmission lines if power is flowing out of the bus through those lines. One or more lines associated with a bus may be considered a load line, and may be classified as an output transmission line if power is flowing from the bus to a load. According to an example embodiment, measurement values may include current on all lines associated with the bus. According to an example embodiment, measurement values may include current on a subset of the lines associated with the bus. According to an example embodiment, measurement values may include current on a subset of the lines associated with the bus, depending on the classification of the transmission line (for example, input, output or load).

In accordance with example embodiments, sampling the measurement values (101) include time-stamping the measurement values (101). According to example embodiments, determining $\Delta Q_{loss}$ and $\Delta P_{flow}$ includes determining a difference between consecutive incoming reactive and outgoing/incoming active power calculations respectively based on time-stamped measurement values (101), wherein the measurement values (101) include raw measurements or processed measurements to eliminate noise. According to an example embodiment, the VSI is determined as $1-(\Delta P_{flow}/\Delta Q_{loss})$. According to an example embodiment, the VSI at the bus (102) is determined when a magnitude of the $\Delta P_{flow}$ exceeds a pre-defined threshold. According to an example embodiment, the pre-defined threshold is about 0.1%.

Example embodiments may include identifying or predicting voltage instability and one or more weak busses of power system based at least in part on one or more of the VSI of one or more busses, a change in the VSI of one or more busses, or a rate of change in the VSI of one or more buses, and facilitating remedial action based at least in part on the identifying or predicting.

According to example embodiments, certain technical effects can be provided, such as creating certain systems and methods that identify or predict voltage instability of a power system. Example embodiments of the invention can provide the further technical effects of providing systems and methods that may be used to identify or predict and one or more weak busses associated with a power system. Example embodiments of the invention can provide the further technical effects of providing systems and methods that may be used to stabilize a power grid and avoid blackouts.

In example embodiments of the invention, control center system 300 may include any number of hardware and/or software applications that are executed to facilitate any of the operations. In example embodiments, one or more I/O interfaces may facilitate communication between the control center system 300 and one or more input/output devices. For example, a universal serial bus port, a serial port, a disk drive, a CD-ROM drive, and/or one or more user interface devices, such as a display, keyboard, keypad, mouse, control panel, touch screen display, microphone, etc., may facilitate user interaction with the control center system 300. The one or more I/O interfaces may be utilized to receive or collect data and/or user instructions from a wide variety of input devices. Received data may be processed by one or more computer processors as desired in various embodiments of the invention and/or stored in one or more memory devices.

One or more network interfaces may facilitate connection of the control center system 300 inputs and outputs to one or more suitable networks and/or connections; for example, the connections that facilitate communication with any number of sensors associated with the system. The one or more network interfaces may further facilitate connection to one or more suitable networks; for example, a local area network, a wide area network, the Internet, a cellular network, a radio frequency network, a Bluetooth™ (owned by Telefonaktiebolaget LM Ericsson) enabled network, a Wi-Fi™ (owned by Wi-Fi Alliance) enabled network, a satellite-based network any wired network, any wireless network, etc., for communication with external devices and/or systems.

As desired, embodiments of the invention may include the control center system 300 with more or less of the components illustrated in FIG. 3.

Certain embodiments of the invention are described above with reference to block and flow diagrams of systems and methods and/or computer program products according to example embodiments of the invention. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, or may not necessarily need to be performed at all, according to some embodiments of the invention.

These computer-executable program instructions may be loaded onto a general-purpose computer, a special-purpose computer, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks. As an example, embodiments of the invention may provide for a computer program product, comprising a computer-usable medium having a computer-readable program code or program instructions embodied therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special-purpose hardware and computer instructions.

While certain embodiments of the invention have been described in connection with what is presently considered to be the most practical and various embodiments, it is to be understood that the invention is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain embodiments of the invention, including the best mode, and also to enable any person skilled in the art to practice certain embodiments of the invention, including making and using any devices or systems and performing any incorporated methods. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The claimed invention is:

1. A method for predicting voltage collapse or instability in a power system, the method comprising:
   sampling measurement values associated with one or more busses, wherein the measurement values comprise:
   current on respective lines associated with a bus; and
   voltage associated with the bus;
   determining a change in reactive power loss ($\Delta Q_{loss}$) on input lines feeding the bus;
   determining a change in real power flow ($\Delta P_{flow}$) on input or output lines associated with the bus; and
   determining a voltage stability index (VSI) at the bus based at least in part on the determined $\Delta Q_{loss}$ and the $\Delta P_{flow}$;
   wherein the VSI is determined as $1-(\Delta P_{flow}/\Delta Q_{loss})$.

2. The method of claim 1, wherein sampling the measurement values further comprises time-stamping the measurement values.

3. The method of claim 2 wherein determining $\Delta Q_{loss}$ and $\Delta P_{flow}$ comprises determining a difference between consecutive time-stamped reactive and active power values calculated from the time stamped measurement values, wherein the measurement values comprise raw measurements or processed measurements to eliminate noise.

4. The method of claim 1, wherein the VSI at the bus is determined when a magnitude of the $\Delta P_{flow}$ exceeds a predefined threshold.

5. The method of claim 1, wherein the VSI is monitored over time and a voltage collapse associated with the bus is predicted when a magnitude of the $\Delta P_{flow}$ exceeds a predefined threshold.

6. The method of claim 1, wherein determining $\Delta Q_{loss}$ comprises determining a summation of the change in the reactive power loss on lines feeding the bus.

7. The method of claim 1, wherein determining $\Delta P_{flow}$ comprises a summation of the change in the real power flow leaving or entering the bus.

8. The method of claim 1, further comprising:
   identifying or predicting voltage instability and one or more weak busses of power system based at least in part on one or more of the voltage stability index (VSI) of one or more busses, a change in the VSI of one or more busses, or a rate of change in the VSI of one or more buses, and facilitating remedial action based at least in part on the identifying or predicting.

9. A system comprising:
   at least one memory for storing data and computer-executable instructions; and
   at least one processor configured to access the at least one memory and further configured to execute the computer-executable instructions for:
   sampling measurement values associated with one or more busses, wherein the measurement values comprise:
   current on respective lines associated with a bus; and
   voltage associated with the bus;
   determining a change in reactive power loss ($\Delta Q_{loss}$) on input lines feeding the bus;
   determining a change in real power flow ($\Delta P_{flow}$) on input or output lines associated with the bus; and
   determining a VSI at the bus based at least in part on the determined $\Delta Q_{loss}$ and the $\Delta P_{flow}$;
   wherein the VSI is determined as $1-(\Delta P_{flow}/\Delta Q_{loss})$.

10. The system of claim 9, wherein sampling the PMUs further comprises time-stamping the measurement values.

11. The system of claim 10 wherein determining $\Delta$Qloss and $\Delta$Pflow comprises determining a difference between consecutive time-stamped reactive and active power values calculated from the time stamped measurement values, wherein the measurement values comprise raw measurements or processed measurements to eliminate noise.

12. The system of claim 9, wherein the VSI at the bus is determined when a magnitude of the $\Delta P_{flow}$ exceeds a predefined threshold.

13. The system of claim 9, wherein the VSI is monitored over time and a voltage collapse associated with the bus is predicted when a magnitude of the $\Delta P_{flow}$ exceeds a predefined threshold.

14. The system of claim 9, wherein determining $\Delta$Qloss comprises determining a summation of the change in the reactive power loss on lines feeding the bus.

15. The system of claim 9, wherein determining $\Delta P_{flow}$ comprises a summation of the change in real power flow leaving the bus.

16. The system of claim 9, wherein the at least one processor is further configured for:
   identifying or predicting voltage instability and one or more weak busses of power system based at least in part on one or more of the VSI (VSI) of one or more busses, a change in the VSI of one or more busses, or a rate of change in the VSI of one or more buses, and
   facilitating remedial action based at least in part on the identifying or predicting.

* * * * *